United States Patent [19]

Allen et al.

[11] 3,865,298

[45] Feb. 11, 1975

[54] SOLDER LEVELING

[75] Inventors: Travis A. Allen; Robert T. Sylvester, both of Albuquerque, N. Mex.

[73] Assignee: The United States of America as represented by the United States Atomic Energy Commission, Washington, D.C.

[22] Filed: Aug. 14, 1973

[21] Appl. No.: 388,305

[52] U.S. Cl. .......................... 228/20, 228/19, 228/21, 118/63, 134/199

[51] Int. Cl. .......................... B23k 1/08, B23k 3/00

[58] Field of Search .......... 228/19, 20, 21; 134/105, 134/107, 151, 199, 200; 118/63; 29/557

[56] References Cited

UNITED STATES PATENTS

| | | | |
|---|---|---|---|
| 3,298,588 | 1/1967 | Shomphe | 228/20 |
| 3,435,801 | 4/1969 | Carini et al. | 118/63 |
| 3,491,779 | 1/1970 | McLain et al. | 228/20 X |
| 3,603,329 | 9/1971 | White et al. | 134/107 |
| 3,653,572 | 4/1972 | Dushkes et al. | 228/20 |
| 3,667,425 | 6/1972 | Bozeman et al. | 118/63 |

*Primary Examiner*—Francis S. Husar
*Assistant Examiner*—Gus T. Hampilos
*Attorney, Agent, or Firm*—John A. Horan; Dudley W. King; Ignacio Resendez

[57] ABSTRACT

Removal of excess or undesirable solder from printed circuit boards that may contain through-holes, conductors, connectors, etc. is accomplished by covering such boards with liquid flux, contacting with liquid solder, removing from the solder, and subsequently passing intermediate offset, hot gas jets which flow hot gas under pressure onto the boards and sweep off undesired solder, clear the holes, and leave an optimum thickness solder layer.

8 Claims, 4 Drawing Figures

SOLDER LEVELING

BACKGROUND OF INVENTION

The invention relates to removing excess or undesirable solder, clearing through-holes, and "leveling off" solder of a printed circuit board (generally referred to for convenience as PCB).

The method of providing a protective coating for thin copper circuit paths (i.e., lands) on PCB and for providing a metallic layer to which components such as transistors can be subsequently soldered onto PCB involves covering the PCB with flux and dipping it into such as hot liquid solder. This may leave an uneven or undesirably thick layer of solder on the PCB which plugs through-holes that connect the two sides of the board.

Prior art methods to remove excess solder, including that located in through-holes, involved inserting the PCB into a machine which sprayed a hot solution such as polyglycol, or other oils such as silicone oil, onto the PCB. The use of these solutions or oils resulted in fumes, dripping, and other like problems being generated. A typical safety problem is that the organic, hot liquid material used is exhausted as a fine mist. Since the organic material may have a flash point such as about 500°F., a hazardous, potentially explosive situation may be created. Repeated sprayings are necessary. These repeated sprayings are time consuming and subject the PCB to repeated thermal shocks and yet, in many instances, do not always remove excess solder from the plated through-holes and conductive lands on PCB, and do not provide a layer of solder of sufficient thickness to meet required specifications, that is, a thickness of solder of a least 0.0003 inch minimum thickness. The prior art inability to repetitively and predictably remove excess solder from through-holes has been resolved by this invention.

Another disadvantage to the prior art process is that prior liquid solder levelers do not permit one step implementation of the etched patternfused solder technique which is being increasingly used in the art.

SUMMARY OF INVENTION

In view of disadvantages of the prior art, it is an object of this invention to provide for removal of excess solder from PCB, clearing of through-holes, and providing of uniform solder coatings, preferably of predetermined thickness greater than at least 0.00005 inch to about 0.001 inch, without the use of repeated sprayings of hot solutions.

It is a further object of this invention to provide an apparatus for removing excess solder from through-holes and lands of PCB which eliminate repeated thermal shocks upon the circuit board and components.

It is a further object of this invention to provide an apparatus for efficiently removing excess solder from PCB, which does away with the disadvantages of prior art apparatus.

It is a further object of this invention to provide for removal of excess solder and cleaning of plated through-holes of diameter as small as 0.020 inch on a repetitive basis.

Various other objects and advantages will become apparent from the following description of this invention and the most novel features wil be pointed out with particularity hereinafter in connection with the appended claims. It is understood that various changes in the details, arrangements, materials, and process steps which are herein described and illustrated to better explain the nature of the invention may be made by those skilled in the art without departing from the scope of the invention.

The invention comprises, in brief, removing excess solder from plated through-holes, conductive lands or areas, etc., of PCB during the solder process comprising contacting the surfaces of the PCB with flux, contacting the fluxed PCB with liquid solder, removing the fluxed PCB from the liquid solder and passing same intermediate offset hot-gas jets thereby flowing hot gas under pressure onto the PCB to remove excess solder yielding thereby a solder coating of uniform thickness with improved solderability.

DETAILED DESCRIPTION

Figures 1, 2:
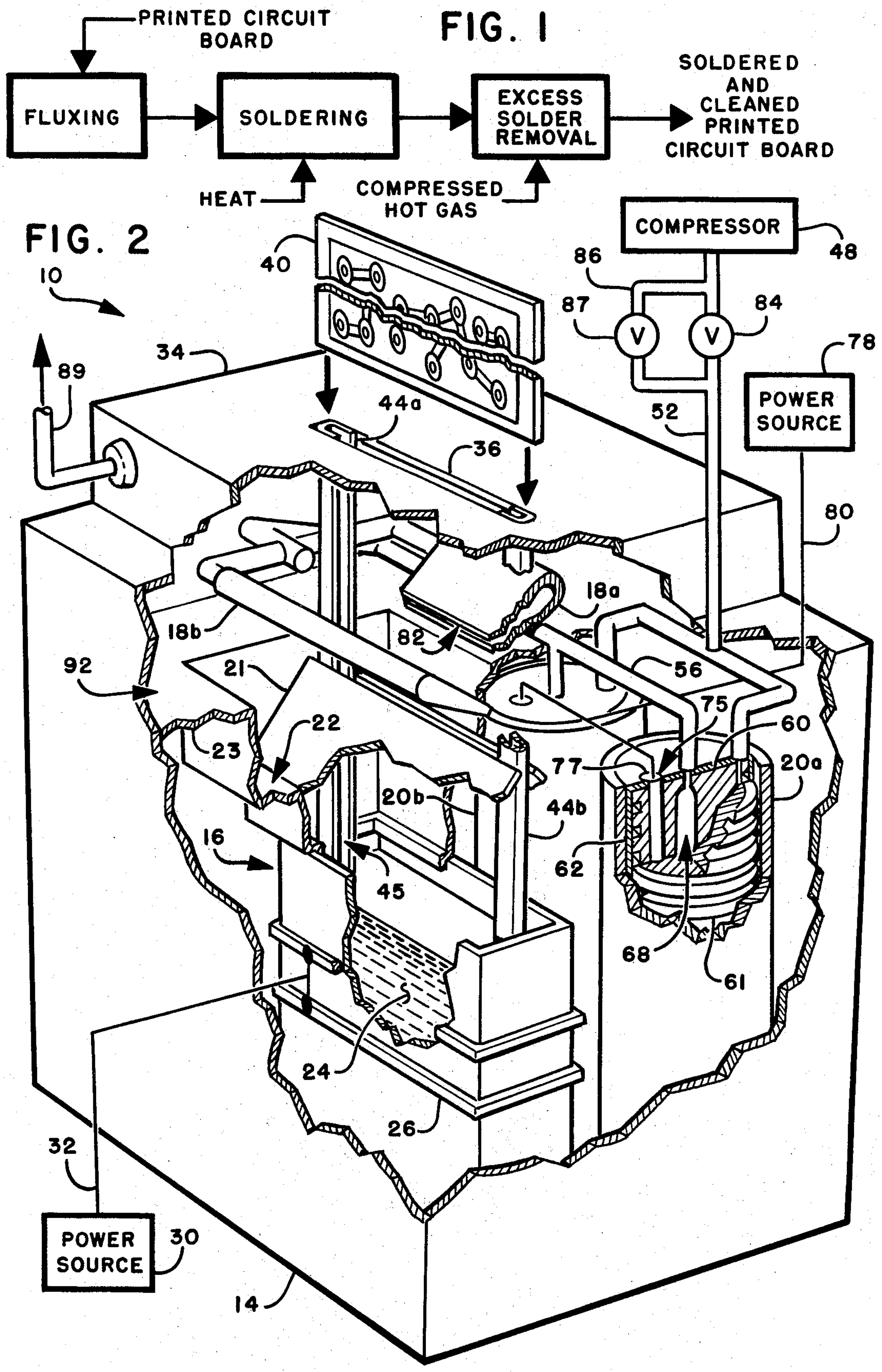
FIG. 1 illustrates in schemtic fashion a flow process for using this invention.
FIG. 2 illustrates in perspective, fragmentary view and partial cross section, an embodiment of apparatus suitable for implementing this invention.
Figure 3:
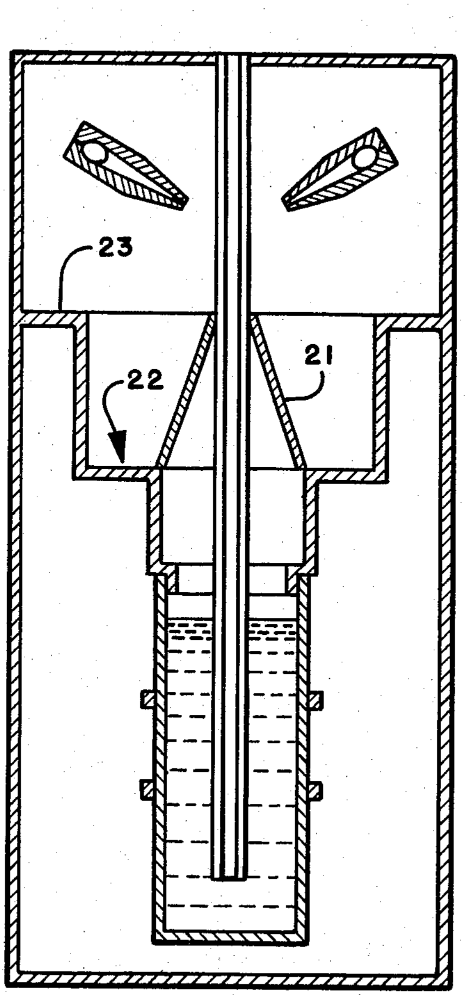
FIG. 3 is a schematic representation of a portion of the embodiment of this invention.

A PCB upon which conductive lands, conductive areas, plated through-holes and connectors are to be coated is first fluxed by dipping, swabbing, immersing or otherwise contacting with a suitable liquid fluxing material as shown in FIG. 1. The PCB should be thoroughly fluxed such as by dipping and a coating of the fluxing material is preferably carried over into the soldering step. The fluxed PCB is then contacted with heated, liquid solder so that the fluxed conductors and connectors may be solder coated. Contacting is preferably by immersion or dipping into a static heated solder pot or bath but may also be by spraying or the like of the solder upon the surface of the printed circuit board. The solder bath is heated to a temperature specific for the solder being used and preferably from about 40°F to about 62°F or more higher than the melting point of the solder. As the PCB is removed from the liquid solder, it is passed between hot gas jets, knives, slots, orifices or the like, from which a heated compressed gas is flowing. The gas may be at a pressure of from about 40 to about 80 pounds per square inch (psi) but preferably is at about 50 psi. The gas used is heated and may be flowing through the opening at a rate of from about 1 to about 8 cubic feet per second per square inch of opening. Inert gas may be used but preferably it is hot air at a temperature of from about 375°F to about 600°F or other suitable temperature compatible with solder removal and clearing of through-holes.

The hot gas, or air, impinging upon the PCB results in the removal of excess solder from the conductors, efficient removal of excess solder from through-holes, a solder deposit of uniform thickness upon the conductive surfaces wherein the thickness may be accurately controlled, and the like. It has been found that, contrary to all expectations, ambient compressed air may be used in this process upon appropriate heating. Although the reason why oxidation is not caused by the use of the hot ambient air is not fully understood, it is believed that the blast of air drives a fine ridge or wave of flux across the solder in advance of the air as a PCB is removed from the solder pot or other contacting medium. This, together with the use of a suitable deflector, prevents contact of air with molten solder. It is to be understood that this theory is not intended to in any way limit or restrict this invention.

FIG. 2 illustrates an apparatus suitable for performing the process described in FIG. 1. The hot gas PCB solder leveler apparatus 10 comprises a housing 14 containing therewithin a solder pot 16, hot gas jets, nozzles or knives 18*a*, 18*b*, gas heaters 20*a*, 20*b*, deflector 21, deflector channel 22, deflector wall 23, and other appropriate conduits, guideways, and the like which will be discussed hereinafter. The housing 14 may be made of any suitable material, such as stainless steel, which is compatible with and not affected by, the heated solder environment. Solder pot 16 contains therein a suitable solder material 24 which is heated and melted by appropriate heating elements or heaters 26 such as electrical resistance heaters or strap type heaters which may be suitably bolted onto the solder pot 16 walls on the exterior thereof. Solder material 24 may also be heated by such as steam coils disposed within solder material 24. Heating elements 26 may be joined to a suitable power source 30 using an electrical connector 32. Housing top 34 contains a passageway, slot or opening 36 through which a suitable part such as a PCB 40 is passed into solder material or bath 24. Guideway elements 44*a* and 44*b* may be disposed in alignment with opening 36 and solder pot 16 permitting the immersion of PCB 40 as diagrammatically represented in FIG. 2 in solder material 24 on a continuing sequential basis and eliminating or reducing a hazardous potential of accidental burning, spillage or the like. Guideway elements 44*a*, 44*b* may include grooves or channels 45 for guiding PCB 40 into the liquid solder. It is to be understood that various and sundry other apparatus may be used as guideways including rollers, chain mechanism, mechanical linkages, etc.

A compressor 48 may be used to introduce air into suitable heaters such as heaters 20*a*, 20*b* described hereinbelow. Air passing through heaters 20*a*, 20*b* is heated to a suitable temperature and transported to hot air knives or nozzles 18*a*, 18*b* by appropriate conduit means 56 joining hot gas nozzles 18*a*, 18*b* with heaters 20*a*, 20*b*. Each heater 20*a*, 20*b* may comprise a cylindrically elongated steel billet 60 having a helical spiral 61 (such as an about 0.50 by 0.50 inch (Acme thread)) cut around the exterior of billet 60 and a sleeve 62 made of a material such as a steel compatible with billet 60 fitted over the exterior of the cylinder to form an airtight groove. Air flows into the spiral 61 groove by means of conduit 52 into the bottom of the billet portion where the exterior spiral 61 extends and communicates to a passageway 68 extending the length of the cylinder and disposed in a central portion of the billet 60. The passageway 68 joined to exterior spiral 61 is preferably of greater cross sectional area than the spiral 61 and may be such as a 1.25 inch diameter passageway. The cylindrical walls and bottom portion of heaters 20*a*, 20*b* are encapsulated in a suitable insulating material 72 for the purpose of preventing heat loss.

Steel billet 60 may have one or more apertures or openings 75 extending parallel to central passageway 68 for a suitable length. These apertures 75 house electrical heating elements 77 which provide the heat for air heaters 20*a* and 20*b*. Heating elements 77 are joined to power source 78 through suitable electrical conductors such as electrical conductor 80. In a typical situation, a continuous flow of hot air adjustable from about 375°F to more than 600°F may be provided by a pair of heaters 20*a*, 20*b* made from two 5 inches × 15 inches steel billets which incorporate or house three 2 ½ kilowatt electrical heating elements.

Figure 4:
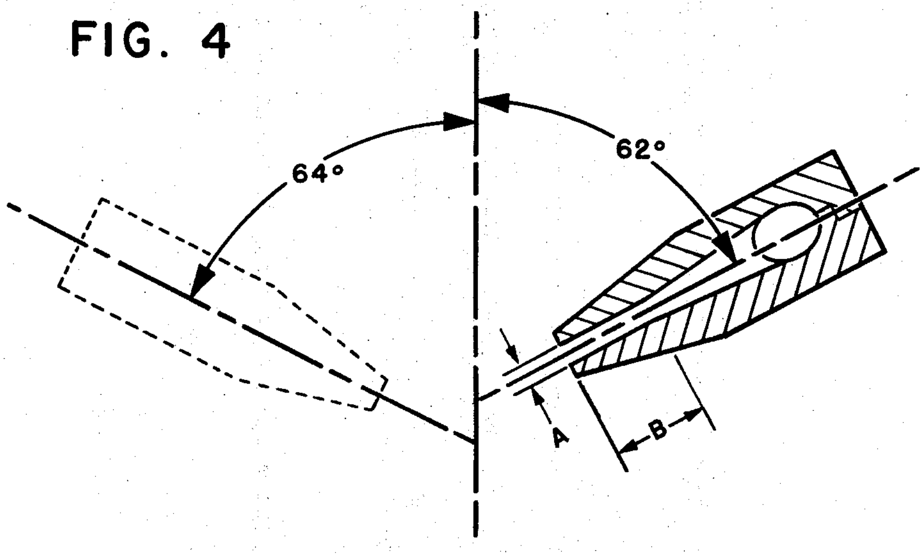
FIG. 4 is a cross section of air knives and their orientations.

The face 82 of the hot air knives 18*a* and 18*b* may comprise an elongated gas nozzle or jet disposed adjacent the solder pot and transverse to movement of the PCB in removing them from the solder pot. The hot air knives 18*a*, 18*b* may be pivotable or otherwise rotatable, preferably in such fashions as to reduce distance of travel of face 82 away from PCB 40. In FIG. 2, hot gas knives 18*a*, 18*b* are pivotable or rotatable about conduit 56 at the conduit and gas knife connection. The angular inclination from horizontal of the slot with respect to the PCB may vary from about 10° to about 70°. The optimum angle, using slot dimensions, air pressure, and other parameters herein stated, has been found to be about 62° for one knife and about 64° for the other knife as shown in FIG. 4. This angular offsetting of knives is especially useful to prevent one knife from flowing directly into its counterpart through through-holes and the like. The nozzle may comprise one long slot. As seen in FIG. 4, typical suitable size may include a slot width A of about 0.016 inch, a depth B of about 0.5 inch and the length of the slot may be such as necessary to direct air against the PCB portion containing conductive lands, through-holes, and the like. The PCB workpiece size will vary upon requirements but PCB of 9 inches by 12 inches by 0.065 inch have been successfully solder-leveled. It is known in the art to leave an excess to be trimmed, i.e., an anti-wicking edge. This edge may also be used to lower into the solder pot by the use of suitable clamps or the like. How much of an anti-wicking edge is trimmed will depend upon procedures employed by manufacturers but success has been achieved while trimming ½ to 1 inch off leaving a workpiece of 7 inches to 8 inches wide.

The hot air or gas flowing out jet or slot face 82 may be at a pressure of from about 20 to about 80 psi and preferably about 50 psi. The solder leveler 10 is preferably provided with a suitable valve appropriately connected into or joined with conduit 52, as shown in FIG. 2, to control the flow rate of the knives. A separate bleed-off conduit 86 including a bleed-off valve 87 is appropriately connected to conduit 52 on each side of valve 84. This bleed-off system maintains the air knives 18*a*, 18*b*, deflector 21, guideways 44*a*, 44*b* and the like in a hot condition ready for use. In this manner there is no waiting period for warm-up of the components. Air flow through bleed valve 87 may be maintained at about .1 cubic feet per second. The hot gas used is exhausted through conduit 89 which is attached to suitable exhaust means such as a 100 to 400 cubic feet per minute exhaust blower. Special venting means such as scrubbers, afterburners or high volume blowers are not required.

As stated hereinabove, the preferred angle of knives 18*a*, 18*b* is 62° for one and 64° for the other. Preferably these are maintained at a distance of from about 0.065 inch to 0.070 inch from the workpiece. The airstream concentrates or narrows as it leaves the nozzle and then diffuses. It is desired to have the workpiece pass through the point of maximum concentration in order to achieve maximum clearing of through-holes, leveling of solder, etc.

The gas stream impinges upon the workpiece as it is removed from the solder pot forming a flux wave which clears the through-holes and levels the solder. The deflector 21 which may be located about 3 inches below the point of impingement of the gas upon the workpiece, may have an about 0.25 inch opening through which the workpiece is passed. As the solder is flowed off the workpiece, it flows back into the solder pot 16 and minimizes the available opening through which the air can enter the solder pot and oxidize the solder. Blowing off of excess solder may prevent the return of some solder into the solder pot. This is collected in deflector channel or solder reservoir 22. This may be skimmed as necessary to separate the flux and the solder returned to solder pot 16. Deflector wall 23 forms a separate chamber 92 with housing top 34 which further permits the heating of chamber 92 and components therewithin to enable the use of solder leveler 10 at any time. The surface of the liquid solder bath may be about 7 inches below the gas knives. It may be desired to have this distance minimized in order to retard or prevent solidification of the solder on PCB between removal from bath and traversal past the air knives. The time elapsed between PCB removal from the bath and beginning of traversal past the air knives is preferably not greater than 0.5 seconds.

In using this invention, the parameters which may be varied to determine solder thickness are air temperature, air pressure or flow rate, and time for traversing the PCB past the knives. For example, to obtain a coating of 0.0005 inch thickness using an appropriate solder such as one having a melting temperature of about 363°F, the air temperature may be about 375°F, the air supply pressure should be about 50 psi, and the time elapsed for traversal of the PCB should be about one-half second. In all cases the PCB should be traversed past the air knives immediately after removal from the solder bath to prevent congealing or solidification of the solder. A minimum coating thickness of about 0.00005 inch may be obtained using the same appropriate solder with the air temperature at about 400°F, air pressure at about 80 psi, and time of traverse being about 2 seconds.

Using the process and apparatus described hereinabove, prior art problems of insufficient solder removal from conductive lands or from plugged holes, repeated thermal shocking of the printed circuit board and components, and the like are largely eliminated. An additional ecological advantage is that greater than about 80 percent of the vaporous effluent from prior art units is eliminated making this invention virtually pollution free. A safety advantage is that by using this invention is lieu of liquid levelers, the fire hazard is considerably reduced since a flammable mist is not generated. Hot gas flowing from the knives 18*a*, 18*b* at about 50 psi levels off solder, clears holes of as low as 0.020 inch diameter on a repetitive reproducible basis, and yet leaves a layer of solder sufficiently thick to meet specifications governing printed circuit board compositions. Thickness may be controlled by adjusting the parameters to yield a coating thickness of from about 0.00005 inch to 0.001 inch or greater as desired. After the PCB has had the solder leveled, it may be washed and degreased in a suitable solvent to remove traces of flux and the like.

While this invention has been described for the removal of solder, those skilled in the art will appreciate that various features of the invention may be employed in other technologies. This invention results in reduced operating costs and a requirement for a minimum amount of floor space. Further, those skilled in the art may recognize that this system may easily be automated by the use of rollers, conveyers and the like, for quantity production.

We claim:

1. Apparatus for removing excess solder from a printed circuit board containing conductive areas and plated through-holes and the like, comprising a container for retaining heated solder, generally vertically disposed guide means for guiding said printed circuit board into and out of said heated solder, jet means above said container for impinging from opposite directions compressed and heated gas onto opposite surfaces of a said printed circuit board, and a deflector disposed intermediate said jet means and said container and inclined downwardly away from said guide means and overlying said container for deflecting said gas away from said container and the surface of said heated solder therein.

2. The apparatus of claim 1 further including a housing generally enclosing said container, guide means, impinging means and said deflector, and a wall of said housing having a slot therethrough in alignment with said guide means for passage of said printed circuit board.

3. The apparatus of claim 2 wherein said guide means comprises a channeled guideway extending from said heated solder to said housing slot; said jet means comprises an elongated slot and means rotatably supporting the jet means for selectively directing gas upon said surfaces of a printed circuit board.

4. The apparatus of claim 3 wherein said deflector is disposed adjacent to said guide means forming an opening for passage of said printed circuit board, and said deflector includes walls forming a solder reservoir around said opening and extending to side walls of said housing thereby forming with said housing a separate compartment.

5. The apparatus of claim 4 together with means for exhausting gas from said separate compartment.

6. The apparatus of claim 4 wherein said deflector opening has a width of about 0.25 inch, said jet means has an elongated slot exit aperture disposed from about 0.065 to about 0.070 inch from said surfaces of said printed circuit board, said jet means are disposed at an angle of from about 10° to about 70° from said generally vertically disposed guide means and said exit apertures have a width of from about 0.016 to about 0.020 inch.

7. The apparatus of claim 6 wherein a said exit aperture is at an angle of about 62° from said generally vertically disposed guide means and an oppositely disposed said exit aperture is at an angle of about 64° from said generally vertically disposed guide means.

8. The apparatus of claim 1 wherein said jet means impinge from opposite, angularly offset directions upon opposite sides of a said printed circuit board.

* * * * *